United States Patent
Huber et al.

(10) Patent No.: US 7,719,450 B2
(45) Date of Patent: May 18, 2010

(54) DEVICE FOR THE PARALLEL-SERIAL CONVERSION OF SEVERAL SIGNAL PARAMETERS EACH DETECTED BY A DETECTOR

(75) Inventors: Johann Huber, Markt Schwaben (DE); Michael Reinhold, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 44 days.

(21) Appl. No.: 12/298,538

(22) PCT Filed: Mar. 21, 2007

(86) PCT No.: PCT/EP2007/002501

§ 371 (c)(1),
(2), (4) Date: Oct. 27, 2008

(87) PCT Pub. No.: WO2007/144035

PCT Pub. Date: Dec. 21, 2007

(65) Prior Publication Data

US 2009/0201183 A1     Aug. 13, 2009

(30) Foreign Application Priority Data

Apr. 26, 2006   (DE) .................. 10 2006 019 486

(51) Int. Cl.
*H03M 9/00* (2006.01)
(52) U.S. Cl. ...................... 341/101; 341/100
(58) Field of Classification Search .............. 341/100, 341/101

See application file for complete search history.

(56) References Cited

U.S. PATENT DOCUMENTS

| 5,055,842 | A | * | 10/1991 | Mueller | 341/100 |
|---|---|---|---|---|---|
| 5,107,264 | A | * | 4/1992 | Novof | 341/101 |
| 5,714,904 | A | | 2/1998 | Jeong | |
| 6,327,275 | B1 | | 12/2001 | Gardner et al. | |
| 6,437,725 | B1 | * | 8/2002 | Kwak et al. | 341/159 |
| 6,741,193 | B2 | * | 5/2004 | Nagata | 341/101 |
| 6,771,194 | B2 | * | 8/2004 | Shi | 341/101 |

FOREIGN PATENT DOCUMENTS

| DE | 206 423 | 1/1984 |
|---|---|---|
| DE | 4407948 A1 | 9/1995 |
| DE | 4407948 C2 | 9/1995 |
| DE | 19961131 A1 | 7/2002 |

OTHER PUBLICATIONS

International Preliminary Report Report on Patentability, PCT/EP2007/002501, Jan. 15, 2009, pp. 1-9.

* cited by examiner

*Primary Examiner*—Jean B Jeanglaude
(74) *Attorney, Agent, or Firm*—Ditthavong Mori & Steiner, P.C.

(57) ABSTRACT

A device for parallel-serial conversion of several evaluation parameters determined respectively by a detector from detected signal values. The device includes a primary buffer memory for the synchronized buffering of each determined evaluation parameter, a synchronization unit for the generation of a synchronization signal for the synchronized buffering and a unit for the serial readout of the evaluation parameters stored in a synchronized manner in the primary buffer memory. A synchronization signal generated by the synchronization unit is derived from a release signal which provides the highest data rate of all the release signals associated respectively with the determined evaluation parameters.

19 Claims, 3 Drawing Sheets

DEVICE FOR THE PARALLEL-SERIAL CONVERSION OF SEVERAL SIGNAL PARAMETERS EACH DETECTED BY A DETECTOR

CROSS-REFERENCE TO RELATED APPLICATIONS

The present application claims priority to PCT Application No. PCT/EP2007/002501, filed on Mar. 21, 2007, and to German Patent Application No. DE 10 2006 019 486.1, filed on Apr. 26, 2006, the entire contents of which are herein incorporated by reference.

BACKGROUND OF THE INVENTION

1. Field of the Invention

The invention relates to a device for the parallel-serial conversion of several signal parameters each detected by a detector.

2. Discussion of the Background

In measuring instruments and systems, especially in spectrum analyzers and network-analyzers, several signal parameters of an electrical or communications signal are generally detected by means of detectors and evaluated in a subsequent processing stage. The signal parameters of the signal can be, for example, the amplitude or the phase of the signal. Evaluation parameters, for example, the maximum value, the minimum value, the average value, the root mean squared values etc. are determined from the sampled values of the signal parameters in a subsequent processing stage.

Since the individual signal parameters and evaluation parameters are detected and processed in different measuring channels, in which functional units, for example, filter stages, with different group-delay times, are realized, these signal parameters and evaluation parameters provide different data delay times and are not synchronized with one another.

A device and a method for balancing the different data delay times of several data occurring in a quasi-parallel manner are already known from DE 199 61 131 A1. The individual, mutually-non-synchronized input signals are synchronized via a synchronization unit, stored in a buffer memory—RAM—and output as serial output signals in a mutually-synchronized manner. In this context, the synchronization unit consists of a variable shift register, into which the respective input signal is read in a serial manner, and a state machine, which controls the throughput time of the input signal through the respective shift register dependent upon the previous data delay time of the input signal. In order to guarantee the synchronization of the individual input signals with one another, the state machines associated with the individual shift registers are referenced with one another by means of a common synchronization signal.

This time referencing of the individual state machines and the associated variable shift register by means of a common synchronization signal with a given clock-pulse rate restricts the synchronization of the individual input signals to signals with an identical data rate. A device of this kind and a method of this kind according to the prior art cannot be used for applications in measurement technology, because the detection and signal processing of the individual signal parameters of the signal to be measured in measuring instruments and systems can be parameterized at different data rates by the user.

SUMMARY OF THE INVENTION

There is a need for a device in which signal parameters of a signal to be measured, each of which is detected and processed at a different data rate, can also be synchronized with one another, and accordingly, a time-corrected presentation of the individual signal parameters of a signal is possible on a display device.

For a time-corrected presentation of several signal parameters of a signal with different data rates, the synchronization of the individual signal parameters of a signal to be measured and presented must be aligned with the most-time-critical signal parameter, that is to say, the signal parameter with the highest data rate. According to an embodiment of the present invention, a synchronization signal for the synchronized buffering of the individual signal parameters in a primary buffer memory and for the subsequent time-corrected visualisation of the individual signal parameters relative to one another in a display device is therefore derived from the release signal associated with the respective signal parameter with the highest data rate.

This release signal, which is activated by the detector detecting the signal or respectively the signal parameter whenever the signal or signal parameter is correctly detected, is also used for the preliminary storage of the signal parameter and the evaluation parameters determined respectively by evaluation from the signal parameter in a secondary buffer memory assigned to the respective detector and disposed upstream of the primary buffer memory. When the signal parameters or respectively the evaluation parameters determined from the latter have been correctly buffered in the respective secondary buffer memory, the detector assigned to the secondary buffer memory is reset and is therefore prepared for a new detection of a new sampled value of the signal parameter.

After the activation of the associated release signal by the secondary buffer memory, in order to buffer the signal parameter with the highest data rate disposed in the secondary buffer memory together with its evaluation parameters, which are also disposed in the secondary buffer memory, in a synchronized manner in the primary buffer memory together with the other signal parameters of slower data rate, which are also disposed in a secondary buffer memory together with their evaluation parameters, the release signal with the highest data rate is delayed by one system-cycle and linked with a signal, which signals the end of the serial readout cycle of the primary buffer memory, in order to generate the synchronization signal.

With the synchronization signal, all of the signal parameters buffered in the individual secondary buffer memories assigned to the respective detectors and their buffered evaluation parameters, which have been stored in one of the secondary buffer memories since the last activation of the synchronization signal, are not only transferred in a synchronized manner into the primary buffer memory, but the serial readout from the primary buffer memory of the signal parameters stored in a synchronized manner in the primary buffer memory together with their evaluation parameters is also started.

The serial readout of the primary buffer memory can be limited via a list parameterized by the user to a few given signal parameters and their associated evaluation parameters. Additionally, the data format of the signal parameters and evaluation parameters read out from the primary buffer memory can be converted into a data format suitable for a subsequent RAM memory.

If, as a result of an incorrect programming of the device, a reactivation of the synchronization signal occurs before the primary buffer memory has been completely read out within a serial readout cycle, an error signal, which stores the release-signal impulses at the maximum data rate counted since the activation of the device for further error analysis, is activated.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1:
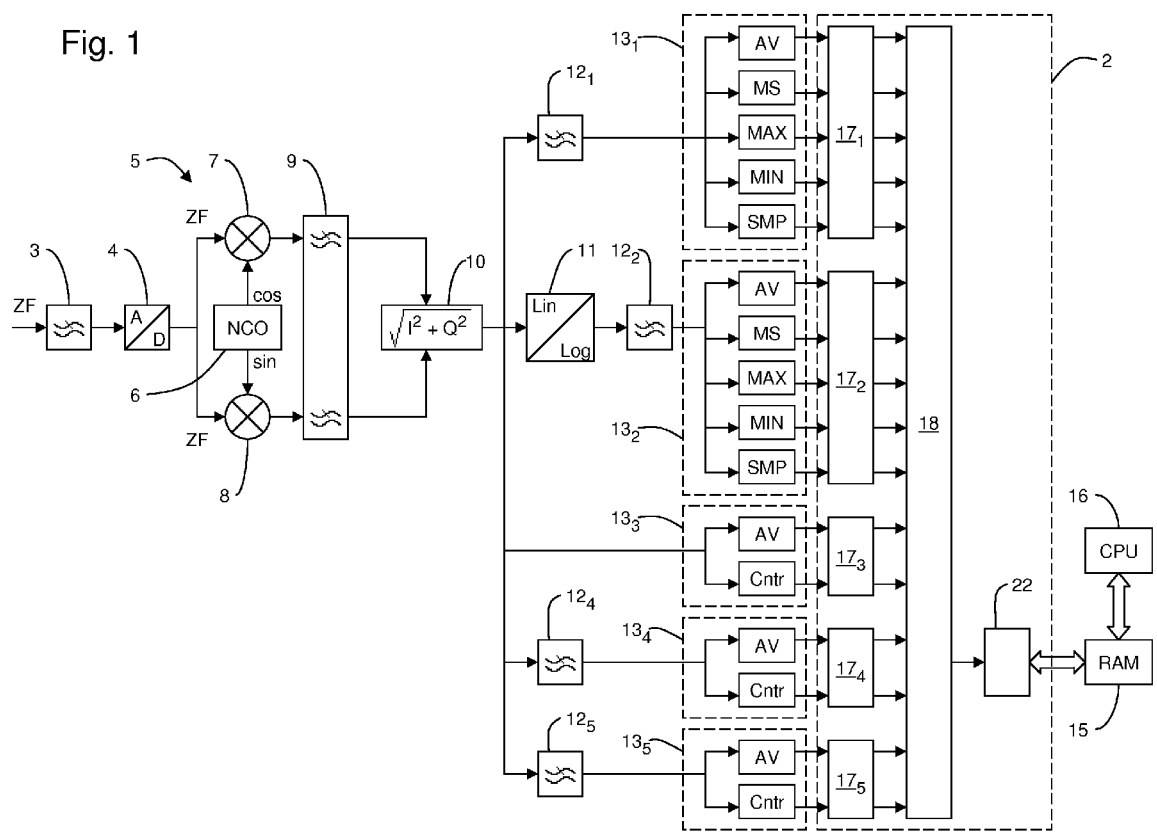
FIG. 1 shows a block-circuit diagram of a spectrum analyzer, in which the device for parallel-serial conversion of several signal parameters each detected by a detector, can be used.

Embodiments of the present invention will be described hereinafter with reference to the accompanying drawings. In the following description, the constituent elements having substantially the same function and arrangement are denoted by the same reference numerals, and repetitive descriptions will be made only when necessary.

FIG. 1 shows a spectrum analyzer 1, which represents, for example, a measuring device or system, in which a device 2 for parallel-serial conversion of several signal parameters each detected by a detector, can be used. FIG. 1 shows only the relevant signal range below the intermediate-frequency stage.

The intermediate-frequency signal marked ZF is filtered in a low-pass filter 3. An analog/digital converter 4 is connected to the low-pass filter 3. This is followed by an I/Q mixing into the baseband in an I/Q demodulator 5, which consists, in the conventional manner, of a numerically-controlled oscillator (NCO) 6 with two outputs phase-displaced through 90°, which are each supplied together with the filtered and A/D-converted intermediate-frequency signal to a mixer 7 of the I-branch and a mixer 8 of the Q-branch.

This stage is followed by a digital filter 9. Modulus formation is then implemented in a modulus-former 10. Logging is implemented in a logger 11. The logger 11 is followed by a video filter $12_2$, which is followed by a detector $13_2$ for detecting, for example, the amplitude of the baseband signal.

For the detection of other signal parameters of the baseband signal, for example, signal-noise distance or DC component of the baseband signal and so on, the baseband signal is picked up at the output of the modulus former 10 and supplied via several parallel signal paths to further detectors $13_1$, $13_3$, $13_4$ or $13_5$.

The detector $13_1$ is supplied, via the low-pass filter $12_1$, with the baseband signal at the output of the modulus former 10. The detector $13_3$ is supplied directly with the baseband signal at the output of the modulus former 10. The detectors $13_4$ or $13_5$ are supplied respectively via the low-pass filters $12_4$ and $12_5$ from the output of the modulus former 10.

An initial statistical evaluation is also implemented in the individual detectors $13_1$, $13_2$, $13_3$, $13_4$ or $13_5$ in addition to the detection of the individual signal parameters. The average value of the signal parameter detected in the respective detector $13_1$, $13_2$, $13_3$, $13_4$ or $13_5$ is determined in each case in an evaluation unit AV. The root mean squared value of the signal parameter detected in the respective detector $13_1$ and $13_2$ is determined in each case in an evaluation unit MS. The maximum value of the signal parameter detected in the respective detector $13_1$ and $13_2$ is determined in an evaluation unit MAX. The minimum value of the signal parameter detected in the respective detector $13_1$ and $13_2$ is determined respectively in an evaluation unit MIN. The number of sampled values is counted in an evaluation unit Cntr of the detector $13_3$, $13_4$ or $13_5$. Moreover, further evaluation units can also be used. Finally, the last sampled value of the signal parameters detected in the respective detector $13_1$ and $13_2$ of an evaluation cycle is buffered in a register SMP.

The outputs of the individual evaluation units AV, MS, MAX, MIN and SMP in the individual detectors $13_1$, $13_2$, $13_3$, $13_4$ and $13_5$ are supplied to the device 2 according to the invention for parallel-serial conversion of several signal parameters each detected in a detector, which is described below with reference to the block-circuit diagrams in FIGS. 2 and 3. The evaluation parameters detected in the device 2 according to the invention for parallel-serial conversion of several signal parameters each detected by a detector, which are output in a serial manner, are written to a RAM memory 15. The evaluation parameters stored in this RAM memory 15 are read out by a processor CPU 16 and supplied to a display device.

Figure 2:
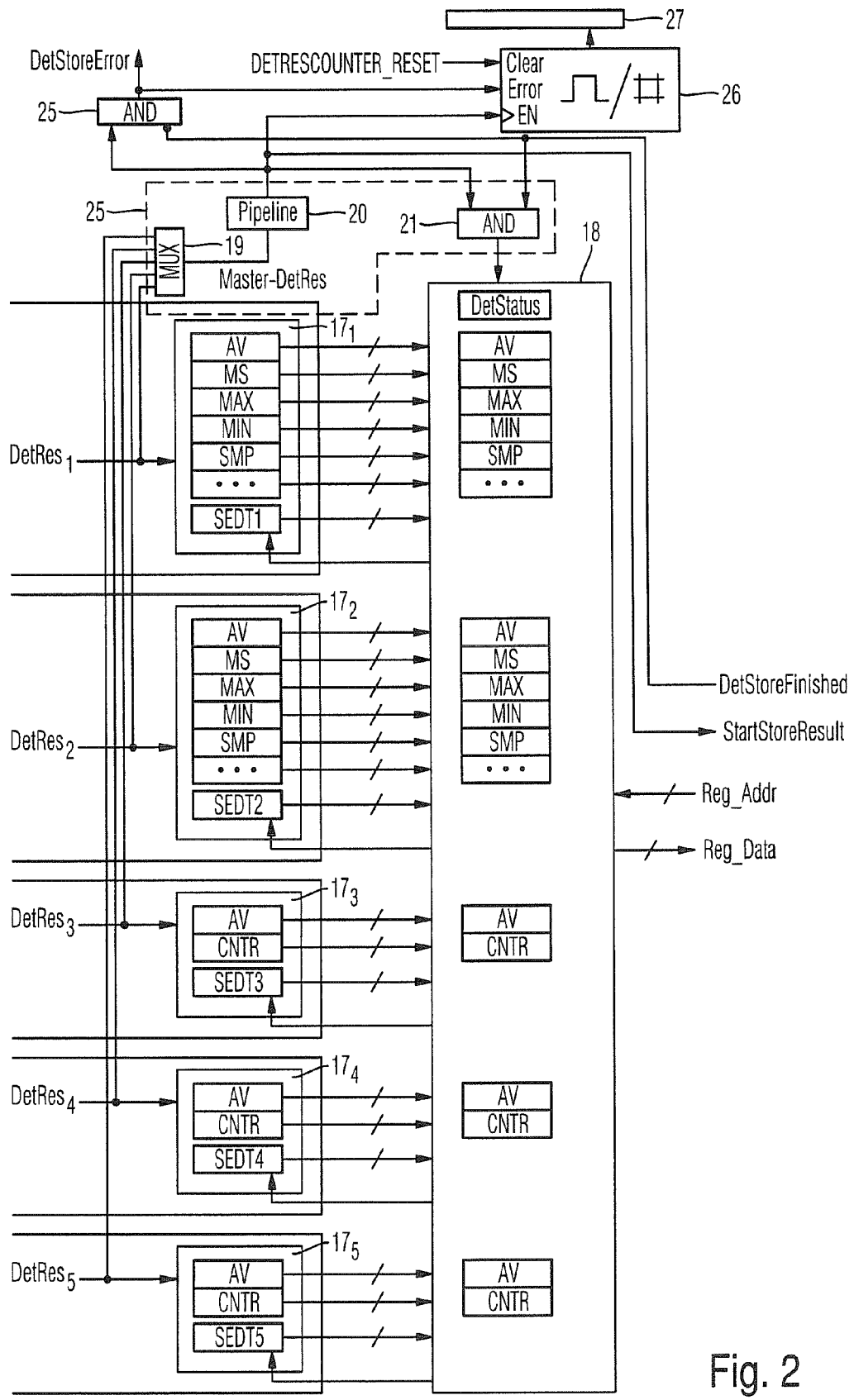
FIG. 2 shows a block-circuit diagram of the functional units for parallel storage of several signal parameters each detected by a detector of the device according to an embodiment of the invention.
Figure 3:
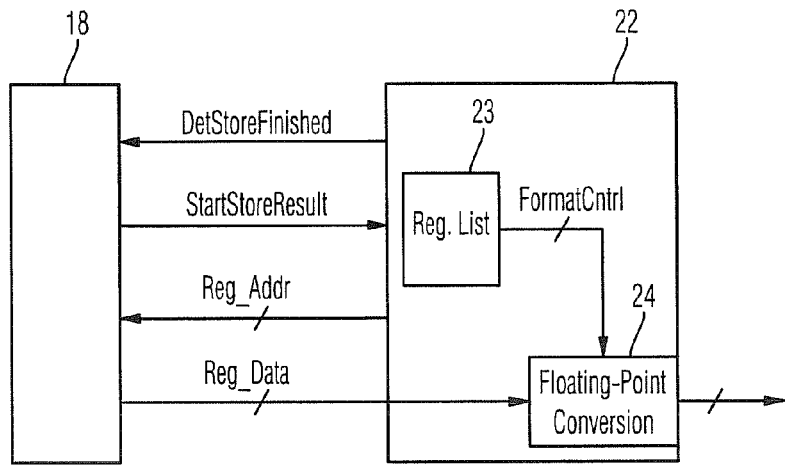
FIG. 3 shows a block-circuit diagram of the functional units for the parallel-serial conversion of the signal parameters stored in parallel of the device according to an embodiment of the invention.

The device 2 according to the invention for the parallel-serial conversion of several signal parameters each detected in a detector consists, as shown in FIG. 2, of secondary buffer memories $17_1$, $17_2$, $17_3$, $17_4$ and $17_5$, each of which is assigned to a detector $13_1$, $13_2$, $13_3$, $13_4$ and $13_5$ and a primary buffer memory 18 connected downstream of the secondary buffer memories $17_1$, $17_2$, $17_3$, $17_4$ and $17_5$. The secondary buffer memories $17_1$, $17_2$, $17_3$, $17_4$, $17_5$, like the detectors $13_1$, $13_2$, $13_3$, $13_4$ and $13_5$, provide buffer memories AV for the evaluation parameters for the average value, MS for the root mean squared value, MAX for the maximum value, MIN for the minimum value, Cntr for the number of sampled values, SMP for the last sampled value of an evaluation cycle with further buffer memories for other evaluation parameters.

With the release signals $DetRes_1$, $DetRes_2$, $DetRes_3$, $DetRes_4$ and $DetRes_5$ generated by the respective detectors $13_1$, $13_2$, $13_3$, $13_4$, $13_5$, which are activated in the presence of a valid evaluation parameter, the individual evaluation parameters are read into the individual buffers of the secondary buffer memories $17_1$, $17_2$, $17_3$, $17_4$ and $17_5$. The updating of the buffers of the secondary buffer memories $17_1$, $17_2$, $17_3$, $17_4$, $17_5$ during the ongoing detection cycle is marked by setting the status bits ($SDET_1$, $SDET_2$, $SDET_3$, $SDET_4$ and $SDET_5$) in the respective secondary buffer memory $17_1$, $17_2$, $17_3$, $17_4$ and $17_5$. When the respective intermediate buffers of the second intermediate memories $17_1$, $17_2$, $17_3$, $17_4$ and $17_5$ have been updated, the respective detectors $13_1$, $13_2$, $13_3$, $13_4$, $13_5$ are reset for a new data detection.

The individual buffers of the secondary buffer memories $17_1$, $17_2$, $17_3$, $17_4$ and $17_5$ are connected to corresponding buffers of the primary buffer memory 18. To achieve a synchronized transmission of the evaluation parameters buffered in the individual buffers of the secondary buffer memory $17_1$, $17_2$, $17_3$, $17_4$ and $17_5$ into the corresponding buffers of the primary buffer memory 18, the release signal MasterDetRes with the highest data rate is selected via the multiplexer 19 from all of the release signals $DetRes_1$, $DetRes_2$, $DetRes_3$, $DetRes_4$ and $DetRes_5$ and connected through to a pipeline component 20 serving as a delaying stage. In the pipeline component 20, the release signal MasterDetRes with the highest data rate is delayed by one system-clock cycle SYSCLK.

The release signal MasterDetRes with the highest data rate delayed by one system-clock cycle SYSCLK is linked in an AND gate 21 with a signal DetStoreFinished, which signals the readout cycle of the primary buffer memory 18, and results in the synchronization signal, with which the synchronized transmission into the primary buffer memory 18 of the evaluation parameters with the highest data rate buffered in the individual secondary buffer memories $17_1$, $17_2$, $17_3$, $17_4$ and $17_5$ within the last detection cycle is implemented. The status registers $SDET_1$, $SDET_2$, $SDET_3$, $SDET_4$ and $SDET_5$ of the secondary buffer memories $17_1$, $17_2$, $17_3$, $17_4$ and $17_5$ indicate whether the individual buffers in the previous detection cycle have been updated. The contents of the status registers $SDET_1$, $SDET_2$, $SDET_3$, $SDET_4$, $SDET_5$ are transmitted with the synchronized transmission of the individual evaluation parameters from the secondary buffer memories $17_1$, $17_2$, $17_3$, $17_4$ and $17_5$ into the status register DetStatus of the primary buffer memory 18.

With the synchronized transmission of the respective evaluation parameters from the individual secondary buffer memories $17_1$, $17_2$, $17_3$, $17_4$ and $17_5$ into the primary buffer memory 18, the activated status bits $SDET_1$, $SDET_2$, $SDET_3$, $SDET_4$, $SDET_5$ in the respective secondary buffer memories $17_1$, $17_2$, $17_3$, $17_4$ and $17_5$ are reset by the primary buffer memory 18.

The delayed release signal MasterDetRes is used not only as a synchronization signal but also as a signal StartStoreResult for the activation of the serial readout process of the individual evaluation parameters transmitted in a synchronized manner to the primary buffer memory 18 within one cycle. For this purpose, the activation signal of the readout process StartStoreResult is supplied to the state machine 22.

On the basis of a register list 23, in which those detectors, of which the evaluation parameters are to be read out in a serial manner from the primary buffer memory 18 by the state machine 22, are marked by the user, the memory addresses Reg_Adr of the individual buffers in the primary buffer memory 18 associated with the marked detector evaluation parameters are created in a serial and cyclical manner in the primary buffer memory 18. After addressing the respective buffers in the primary buffer memory 18 with the memory address Reg_Adr, the evaluation parameters stored therein are transmitted via the data bus Reg_Dat from the primary buffer memory 18 to the state machine 22.

In a conversion unit 24 within the state machine 22, the evaluation parameters transmitted on the data bus Reg_Dat are converted, on the basis of an item of information FormatCntrl stored in the register lists 23, via an evaluation-parameter-specific conversion requirement, into a data format suitable for the subsequent RAM memory 15.

After the completion of a serial readout cycle of the primary buffer memory 18 by the state machine 22, the signal DetStoreFinished, which signals the conclusion of a readout cycle of the primary buffer memory 18, is activated by the state machine, as described above. With the activation of this signal DetStoreFinished, a new synchronized transmission to the buffer memory 18 and storage of the evaluation parameters determined in each case in a quasi-parallel manner by several detectors $13_1$, $13_2$, $13_3$, $13_4$ and $13_5$ can be implemented upon the arrival of a new release-signal impulse MasterDetRes of the highest data rate via the AND gate 21.

If an activation of the release signal MasterDetRes with the highest data rate is implemented as a result of an error programming of the detectors $13_1$, $13_2$, $13_3$, $13_4$, $13_5$, for example, a readout of too many evaluation parameters from the primary buffer memory 18 per readout cycle before the readout cycle of the primary buffer memory 18 is concluded with the activation of the signal DetStoreFinished, an error signal DetStoreError is activated via the gate component 25 as shown in FIG. 2. This error signal DetStoreError is used for the transmission of the release-signal impulses MasterDetRes of the highest data rate counted in the counter 26 to an error register 27. The user can use this error register 27 for further error analysis.

Figure 4:
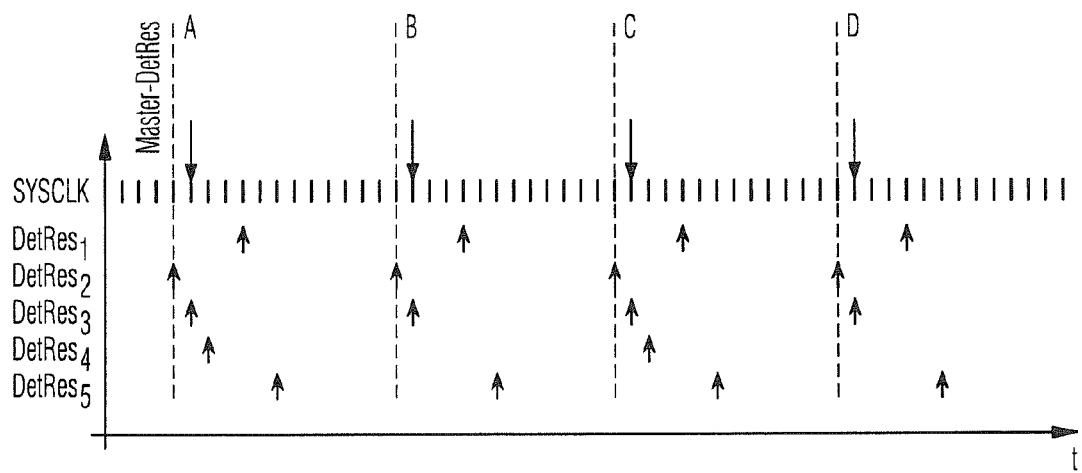
FIG. 4 shows a time-flow diagram of the individual release signals associated with each detector and of the synchronization signal generated by the latter.

On the basis of time-flow diagram, FIG. 4 once again presents the generation of the synchronization signal for the synchronized storage in the primary buffer memory 18 of signal parameters detected by several detectors operating in parallel and the evaluation parameters determined from the latter. The release signal $DetRes_2$ of the detector $13_2$ is used as a selected release signal MasterDetRes for the generation of the synchronization signal and is delayed in the pipeline component 20 by one clock cycle of the system clock SYSCLK. The synchronization signal is generated at the timing points A, B, C and D in each case. At these timing points, all evaluation parameters from detectors are stored in a synchronized manner in the primary buffer memory 18. As shown in FIG. 4, the release signal $DetRes_4$ provides half the data rate by comparison with the release signals $DetRes_1$, $DetRes_2$, $DetRes_3$ and $DetRes_5$, so that the evaluation parameters of the detector $13_4$, which have been transmitted from the primary buffer memory 18 into the RAM memory 15, are read out by the state machine 22 only at the timing points B and D.

The invention is not restricted to the exemplary embodiment presented. For example, the device according to the invention is also suitable for the parallel-serial conversion of asynchronous signals, which do not originate from a detector, for instance, in the case of a memory management. All the features described and characterized can be combined with one another as required within the framework of the invention.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

The invention claimed is:

1. A device for parallel-serial conversion of several evaluation parameters determined respectively by a detector from detected signal values, said device comprising:
   a primary buffer memory for synchronized buffering of each determined evaluation parameter;

a synchronization unit for the generation of a synchronization signal for the synchronized buffering; and a unit for serial readout of the evaluation parameters stored in a synchronized manner in said primary buffer memory, wherein each detector generates a release signal, which marks the validity of the determined evaluation parameter, and the synchronization signal generated by said synchronization unit is derived from the release signal which provides a maximum data rate of all the release signals associated with each of the determined evaluation parameters.

2. The device according to claim 1, wherein the release signal associated with the determined evaluation parameter is generated by a detector which implements the determination of the evaluation parameter.

3. The device according to claim 2, wherein the buffering of the evaluation parameter determined by the detector is implemented in a secondary buffer memory assigned to the detector and a resetting of the detector is implemented after the activation of the associated release signal by the respective detector.

4. The device according to claim 3, wherein the synchronization signal is activated with a delay after the activation of the release signal with a highest data rate.

5. The device according to claim 4, wherein a synchronized buffering of the evaluation parameters from said respective secondary buffer memory into said primary buffer memory is implemented after the completion of the serial readout of the evaluation parameters last stored in a synchronized manner in said primary buffer memory and with a delayed activation of the release signal with the highest data rate.

6. The device according to claim 1, wherein the serial readout of the evaluation parameters buffered in a synchronized manner in said primary buffer memory is implemented with a delayed activation of the synchronization signal.

7. The device according to claim 1, wherein individual evaluation parameters can be selected for the serial readout of the evaluation parameters buffered in a synchronized manner in said primary buffer memory.

8. The device according to claim 3, wherein evaluation parameters determined for the individual signal parameters are buffered in said respective secondary buffer memory and in said primary buffer memory.

9. The device according to claim 8, wherein the evaluation parameters are converted into another data format after the serial readout of the evaluation parameters buffered in a synchronized manner in said primary buffer memory.

10. The device according to claim 8, wherein an error signal is activated in the event of a reactivation of the synchronization signal during the serial readout of the evaluation parameters buffered in a synchronized manner in said primary buffer memory.

11. The device according to claim 9 wherein an error signal is activated in the event of a reactivation of the synchronization signal during the serial readout of the evaluation parameters buffered in a synchronized manner in said primary buffer memory.

12. The device according to claim 1, wherein the synchronization signal is activated with a delay after the activation of the release signal with a highest data rate.

13. The device according to claim 2, wherein the synchronization signal is activated with a delay after the activation of the release signal with a highest data rate.

14. The device according to claim 2, wherein the serial readout of the evaluation parameters buffered in a synchronized manner in said primary buffer memory is implemented with a delayed activation of the synchronization signal.

15. The device according to claim 3, wherein the serial readout of the evaluation parameters buffered in a synchronized manner in said primary buffer memory is implemented with a delayed activation of the synchronization signal.

16. The device according to claim 4, wherein the serial readout of the evaluation parameters buffered in a synchronized manner in said primary buffer memory is implemented with a delayed activation of the synchronization signal.

17. The device according to claim 5, wherein the serial readout of the evaluation parameters buffered in a synchronized manner in said primary buffer memory is implemented with a delayed activation of the synchronization signal.

18. A device for parallel-serial conversion of several evaluation parameters determined respectively by a detector from detected signal values, each detector generating a release signal that marks the validity of the determined evaluation parameter, said device comprising:

a primary buffer memory configured to perform synchronized buffering of each determined evaluation parameter;

a synchronization unit configured to generate a synchronization signal for the synchronized buffering; and a unit configured to perform serial readout of the evaluation parameters stored in a synchronized manner in said primary buffer memory, wherein the synchronization signal generated by said synchronization unit is derived from the release signal which provides a maximum data rate of all the release signals associated with each of the determined evaluation parameters.

19. A method for parallel-serial conversion of several evaluation parameters from detected signal values, said method comprising:

determining evaluation parameters respectively by a detector from the detected signal value;

generating a release signal by each detector that marks the validity of the determined evaluation parameter;

generating a synchronization signal that is derived from the release signal which provides a maximum data rate of all the release signals associated with each of the determined evaluation parameters;

performing synchronized buffering of each determined evaluation parameter in a buffering memory using the synchronization signal; and performing a serial readout of the evaluation parameters stored in a synchronized manner in the buffer memory.

* * * * *